United States Patent
Yang

(10) Patent No.: US 6,717,253 B2
(45) Date of Patent: Apr. 6, 2004

(54) ASSEMBLY PACKAGE WITH STACKED DIES AND SIGNAL TRANSMISSION PLATE

(75) Inventor: Chaur-chin Yang, Tainan (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 10/293,123

(22) Filed: Nov. 12, 2002

(65) Prior Publication Data

US 2003/0141583 A1 Jul. 31, 2003

(30) Foreign Application Priority Data

Jan. 31, 2002 (TW) .......................... 91101714 A

(51) Int. Cl.⁷ .................. H01L 23/02; H01L 29/40; H01L 23/48
(52) U.S. Cl. ................. 257/686; 257/723; 257/777; 257/778; 257/698; 257/712; 257/738; 257/737; 257/691; 257/784; 257/786
(58) Field of Search ................. 257/686, 777, 257/723, 778, 698, 712, 738, 737, 691, 784, 786, 685, 717, 779, 693, 664, 662, 668, 678

(56) References Cited

U.S. PATENT DOCUMENTS

| | | | | |
|---|---|---|---|---|
| 4,949,224 A | * | 8/1990 | Yamamura et al. | 361/784 |
| 6,043,109 A | * | 3/2000 | Yang et al. | 438/113 |
| 6,285,559 B1 | * | 9/2001 | Fukiharu | 361/760 |
| 6,316,840 B1 | * | 11/2001 | Otani | 257/787 |
| 6,507,115 B1 | * | 1/2003 | Hofstee et al. | 257/777 |
| 2001/0048151 A1 | * | 12/2001 | Chun | 257/686 |
| 2002/0027281 A1 | * | 3/2002 | Goto | 257/693 |
| 2002/0064905 A1 | * | 5/2002 | Park et al. | 438/109 |
| 2002/0105096 A1 | * | 8/2002 | Hirata et al. | 257/786 |
| 2002/0134582 A1 | * | 9/2002 | Celaya et al. | 174/261 |
| 2002/0153615 A1 | * | 10/2002 | Komiyama et al. | 257/777 |
| 2003/0062612 A1 | * | 4/2003 | Matsuo et al. | 257/686 |
| 2003/0102547 A1 | * | 6/2003 | Higashi et al. | 257/686 |

FOREIGN PATENT DOCUMENTS

| | | | | |
|---|---|---|---|---|
| JP | 5-175279 | * | 7/1993 | 361/764 |
| KR | 2003-195986 | * | 11/2002 | |

* cited by examiner

Primary Examiner—Alexander Oscar Williams
(74) Attorney, Agent, or Firm—Martine & Penilla, LLP

(57) ABSTRACT

An assembly package includes a substrate, a first die, at least one signal transmission plate, at least one second die, a plurality of conductive wires, and a molding compound. The first die is electrically connected with the substrate using flip-chip bonding. The signal transmission plate is provided on the first die and includes an insulating layer, a layout wire layer, and a solder mask layer. The layout wire layer is formed on the insulating layer, and the solder mask layer is formed on the layout wire layer. The solder mask exposes partial area of the layout wire layer at the center and peripheries of the signal transmission plate to form a plurality of die bonding pads and a plurality of wire bonding pads. The second die is electrically connected with the die bonding pads using flip-chip bonding, and the wire bonding pads are electrically connected with the substrate via the conductive wires so that the signals from the second die are transmitted to the substrate. In addition, the molding compound is used to encapsulate the first die, the signal transmission plate, the second die, and the conductive wires.

12 Claims, 3 Drawing Sheets

ASSEMBLY PACKAGE WITH STACKED DIES AND SIGNAL TRANSMISSION PLATE

BACKGROUND OF THE INVENTION

1. Field of the Invention

The invention relates to an assembly package and, more particularly, to an assembly package that integrates more than one die into one package by using at least one signal transmission plate.

2. Description of the Related Art

During the recent years, due to the steady increase of demand of consumer electronic products, namely, cellular phones, personal digital assistants (PDAs) and digital cameras, package structures are developed toward being light in weight and small in size with short signal transmission distances. Based upon such trend, in order to save package area as well as to improve problems such as signal distortion, delay or power loss, an assembly package integrates at least one die into a same package structure by perpendicular stacking.

Referring to FIG. 1, a conventional ball grid array (BGA) package 1 mainly includes a bottom die 12, a top die 15, and a plurality of conductive wires 16 and 17. The bottom die 12 is provided on the substrate 11 and the top die 15 is provided on the bottom die 12. Between the top die 15 and the bottom die 12, a non-conductive adhesive 13, silver paste for example, is applied, so that the top die 15 is fixed to the bottom die 12 while also insulated from the bottom die 12. The bottom die 12 and the top die 15 are signally connected with the substrate 11 via the conductive wires 16 and 17, gold wires for example, respectively. Thermosetting plastics are used as the molding compound 18, through molds and by a molding press, to fill and encapsulate the conductive wires 16 and 17, the bottom die 12, and the top die 15, thereby casting by baking. In addition, on the other side of the substrate 11 is provided with solder balls 19, which are placed onto the solder pads on the substrate 11 and connected with the exterior to transmit signals.

With such an assembly package technique, two or more dies may be integrated into a same package. Nevertheless, by using conductive wires to electrically connect I/O pins of individual die with the substrate for signal transmission, the signal transmission quality of the die may be affected by the transmission distance and the number of conductive wires. More particularly, driven by the multi-function and high performance requirements demanded by the modern electronic products, dies having high 110 pin-counts are the development trend. However, the longer the transmission distance of conductive wires gets, the noise increases accordingly, and the signal distortion and hysteresis become more apparent, thereby dropping the signal transmission quality.

Therefore, it is a vital task to improve the signal transmission quality and speed up the signal transmission rate of assembly packages.

SUMMARY OF THE INVENTION

In view of the above issue, the object of the invention is to provide an assembly package having good signal transmission quality and fast transmission rate.

To achieve the above object, the invention provides an assembly package including a substrate, a first die, at least one signal transmission plate, at least one second die, a plurality of conductive wires, and a molding compound. The first die is electrically connected to the substrate using flip-chip bonding. The signal transmission plate is provided on the first die and has at least one insulating layer, at least one layout wire layer, and a solder mask layer. The layout wire layer is formed on the insulating layer, and the solder mask layer is formed on the layout wire layer. The solder mask layer exposes partial area of the layout wire layer at the center and peripheries of the signal transmission plate to form a plurality of die bonding pads and a plurality of wire bonding pads. The second die is electrically connected with the die bonding pads using flip-chip bonding, and the wire bonding pads are electrically connected to the substrate via the conductive wires so that signals from the second die are transmitted to the substrate. Furthermore, thermosetting plastics are used to encapsulate the first die, the signal transmission plate, the second die and the conductive wires.

The assembly package of the invention employs flip-chip bonding, so that the signals from the first die (the bottom die) are transmitted to the substrate. Therefore, imperfect electricity caused by using lead connection is prevented. Also, the second die also utilizes flip-chip bonding so that the signals are transmitted to the signal transmission plate and then to the substrate via the conductive wires. As a result, the conductive wires are not required to connect to the joints on the top die; only the signal transmission plate is needed to connect with the wire bonding pads, and signals from the top die can be transmitted to the substrate. In other words, the signal transmission quality is improved, and the signal transmission rate is also increased, for that the transmission distance of the conductive wires is shortened.

PREFERRED EMBODIMENT OF THE INVENTION

The assembly package of the invention will be described with reference to the accompanying drawings.

Figure 1:
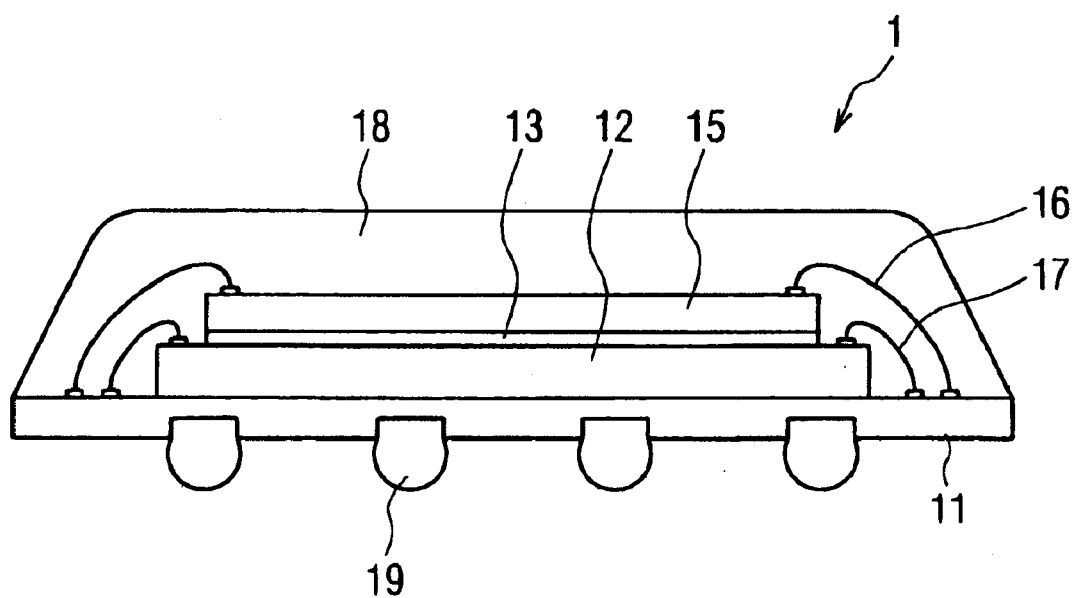
FIG. 1 shows a conventional assembly package.
Figure 2:
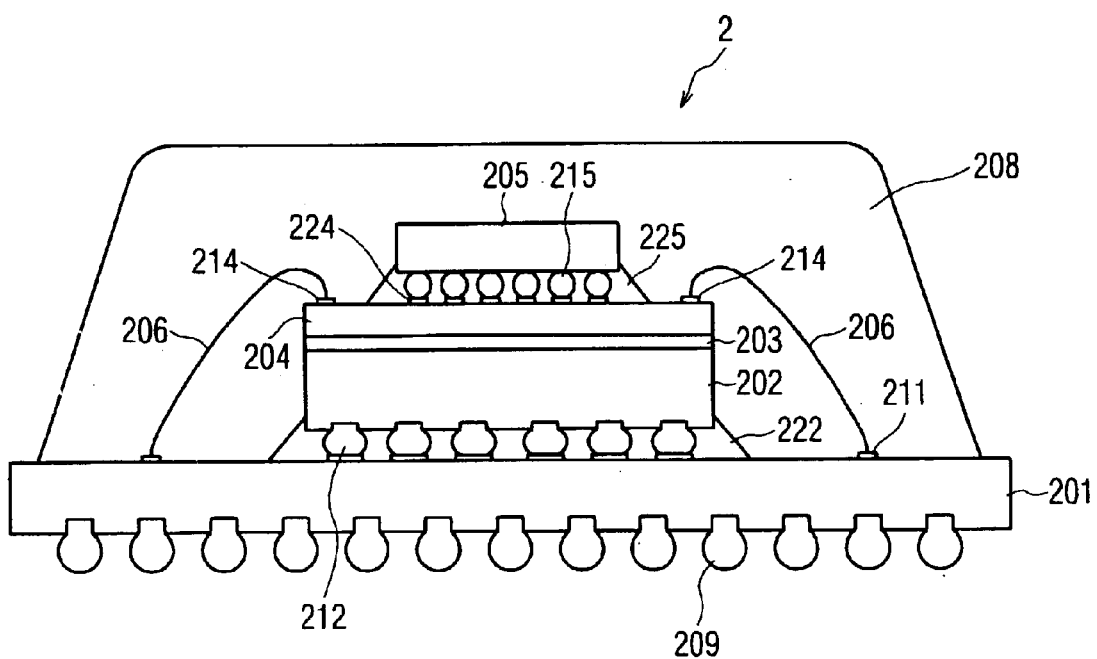
FIG. 2 shows an assembly package in accordance with the invention, which uses a signal transmission plate to integrate two dies into one package.

Referring to FIG. 2, an assembly package 2 of the invention includes a first die 202, a signal transmission plate 204, a second die 205, and a plurality of conductive wires 206. The first die 202 is provided with a plurality of first bumps 212, solder bumps for instance, which are electrically connected with a substrate 201 using flip-chip bonding. Between the substrate 201 and the first die 202 is an underfill 222 to prevent the stress concentration brought about by different thermal expansion coefficients of the substrate 201 and the first die 202.

Figure 3:
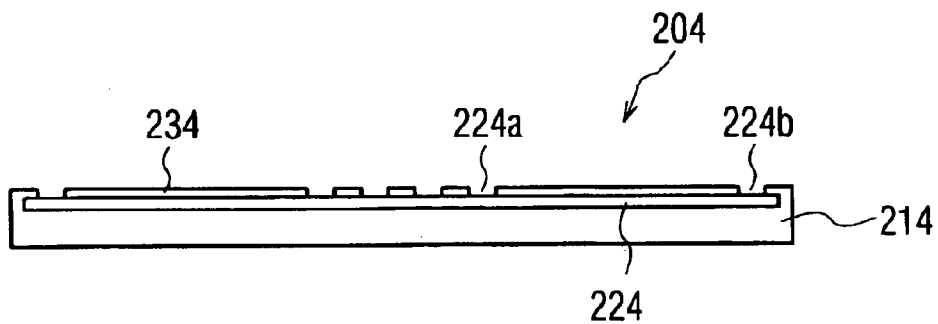
FIG. 3 is a sectional view showing a signal transmission plate in the assembly package of the invention.
Figure 4:
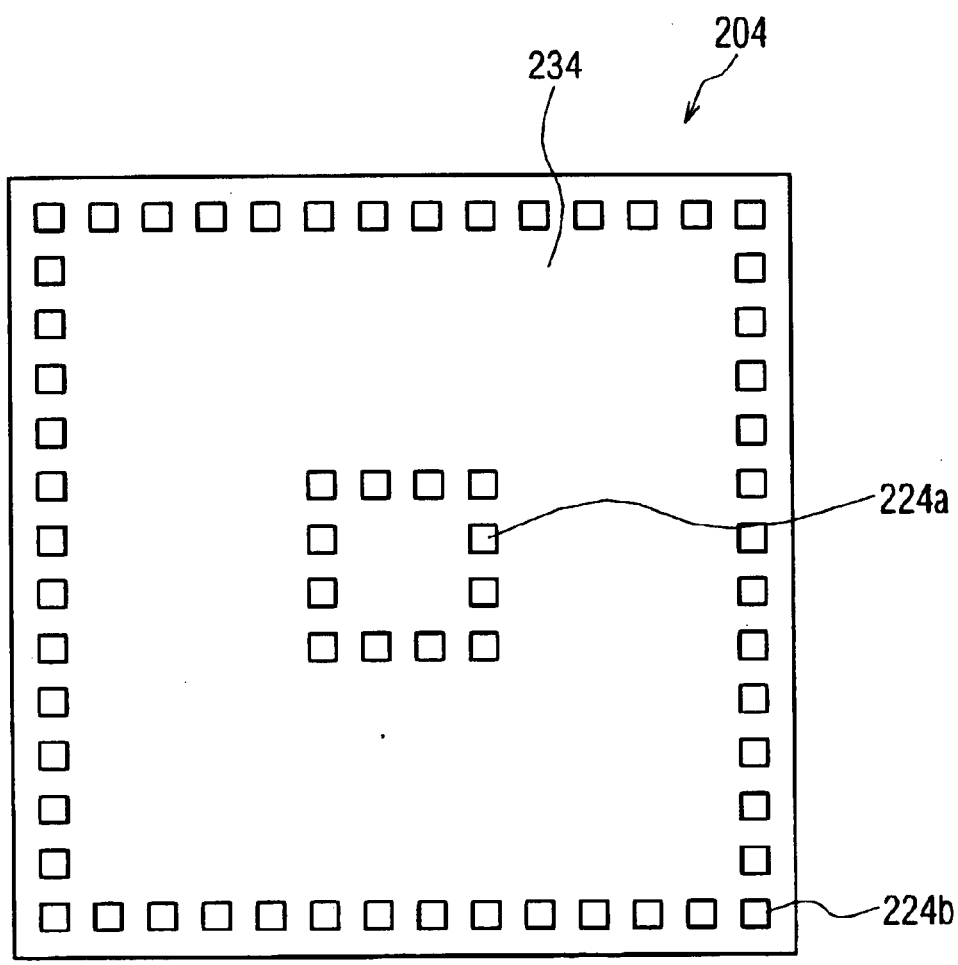
FIG. 4 is a front view showing the signal transmission plate in the assembly package of the invention.

The signal transmission plate 204 is fixed onto the first die 202 by using an adhesive 203, for example, silver paste or non-conductive materials such as epoxy. Referring to FIG. 3, the signal transmission plate 204 includes an insulating layer 214, a layout wire layer 224, and a solder mask layer 234. The insulating layer 214 can be formed of glass epoxy (FR-4, FR-5) or bismaleimide triazine (BT). On the surface of the insulating layer 214 is a copper foil or a foil of other metal with good conductance. The metal foil forms the layout wire layer 224 after patterning processes namely applying photoresist, exposure, developing, and removing photoresist. On the surface of the layout wire layer 224 is provided with the solder mask layer 234, which can be formed of epoxy. The solder mask layer can also be formed of UV cure green enamel or thermal cure green enamel via roller coating or curtain coating. Similarly, the solder mask layer 234 is patterned to have its partial area expose the layout wire layer 224 to form a plurality of die bonding pads 224a and a plurality of wire bonding pads 224b. Referring to FIG. 4, the die bonding pads 224a are provided in the central part of the signal transmission plate 224, whereas the wire bonding pads 224b are provided on the peripheries of the signal transmission plate 224.

Referring to FIG. 2 again, the second die 205 is provided on the signal transmission plate 204, and one side of the second die 205 is provided with metal bumps 215 such as solder bumps. The metal bumps 215 are first applied with flux so that the solder bumps 215 are jointed with the die bonding pads 224 of the signal transmission plate 224 after reflow. That is, the second die 205 is electrically connected with the signal transmission plate 204 using flip-chip bonding. Moreover, an underfill is filled between the signal transmission plate 205 and the solder bumps 215 to prevent the stress concentration effect brought about by thermal stress, which decreases the yield rate.

The second die 205 uses flip-chip bonding so that signals from the second die 205 can be transmitted to the die bonding pads 224a via the second metal bumps 215. The die bonding pads 224a and the wire bonding pads 224b are the layout wire layer 224 exposed at the solder mask layer 234, and therefore the two are electrically connected with each other. Therefore, signals from the second die 205 can be transmitted to the wire bonding pads 224b via the layout wire layer 224. Then, signals from the second die 205 can be transmitted onto the substrate 201 via the conductive wires, gold wires for example, connecting the wire bonding pads 224b and the substrate pad 211.

Generally, thermosetting plastics are used as the molding compound 208, which is used to encapsulate the first die 202, the signal transmission plate 204, the second die 205, and the conductive wires 206 to prevent contamination of the surroundings and damage of external forces. Solder balls 209 can be formed by placing a lead-tin alloy or other metallic materials onto the solder pads on the substrate 201, so as to connect with the exterior, a circuit board for instance, for signal transmission.

It is to be noted that the signal transmission plate of this embodiment is a two-layer plate composed of an insulating layer and a layout mask layer. However, for dies with high pin-counts, a signal transmission plated formed by several insulating layers and several layout mask layers alternately overlapping one another can be used to fulfill the wire layout requirement. Like common multi-layer plates, through holes among the insulating layers are demanded between the layout mask layers to accomplish signal connection. The through holes may be provided by machine drilling. Sidewalls of the through holes are plated with a metal layer, and a hole-filling material is stuffed into the through holes.

Furthermore, in this embodiment, a two-layer stacked die is used as an example. Furthermore, another transmission plate and die can be stacked onto the second die to achieve another type of assembly package.

Conclusive from the above, the assembly package of the invention employs flip-chip bonding to have signals of the first die (the bottom die) transmitted to the substrate, and therefore imperfect electricity caused by using lead connection is prevented. In addition, the second die (the top die) also uses flip-chip bonding to have signals transmitted to the signal transmission plate, and then the signals are transmitted to the substrate via the conductive wires. As a result, in order to have the signals of the top die transmitted to the substrate, the conductive wires do not need to connect to the joints on the top die, but only need to connect to the wire bonding pads on the signal transmission plate. That is, by shortening the transmission distance of the conductive wires, the objects namely reducing the impedance and signal hysteresis, and speeding up the signal transmission rate can be accomplished, thereby enhancing the performance of the product as a whole. Also, the signal transmission plate can be a multi-layer pressed or laminated substrate to fulfill the requirements of devices with high I/O pin-counts.

The embodiment described is only illustrative to the technical content of the invention, but not to limit the invention within them. Various modifications can be made without departing from the true spirit and the scope of the appended claims.

What is claimed is:

1. An assembly package comprising:
    a substrate;
    a first die electrically connected with the substrate;
    at least one signal transmission plate provided on the substrate, the signal transmission plate including at least one insulating layer, at least one layout wire layer, and a solder mask layer, wherein the layout wire layer is formed on the insulating layer, the solder mask layer is formed on the layout wire layer, the solder mask layer exposes partial area of the layout wire layer at the center and peripheries of the signal transmission plate to form a plurality of die bonding pads and a plurality of wire bonding pads;
    at least one second die electrically connected to the die bonding pads;
    a plurality of conductive wires for electrically connecting the wire bonding pads and the substrate; and
    a molding compound for encapsulating the first die, the signal transmission plate, the second die and the conductive wires.

2. The assembly package as claimed in claim 1, further comprising an adhesive for fixing the signal transmission plate onto the first die.

3. The assembly package as claimed in claim 2, wherein the adhesive is a silver paste.

4. The assembly package as claimed in claim 1, wherein the signal transmission plate further comprises at least one insulating layer, at least one layout wire layer formed on the insulating layer, and a solder mask layer formed on the layout wire layer.

5. The assembly package as claimed in claim 4, wherein the solder mask layer exposes partial area of the layout wire layer at the center and peripheries of the signal transmission plate to form the die bonding pads and the wire bonding pads.

6. The assembly package as claimed in claim 4, wherein the layout wire layer is formed by patterning a metal foil.

7. The assembly package as claimed in claim 6, wherein the metal foil is a copper foil.

8. The assembly package as claimed in claim 4, wherein the insulating layer is formed of bismaleimide triazine (BT).

9. The assembly package as claimed in claim 4, wherein the insulating layer is formed of glass epoxy.

10. The assembly package as claimed in claim 1, further comprising a plurality of first metal bumps provided on the first die, so that the first die is electrically connected with the substrate by flip-chip bonding.

11. The assembly package as claimed in claim 1, further comprising a plurality of second metal bumps provided on the second die, so that the second die is electrically connected with the die bonding pad by flip-chip bonding.

12. The assembly package as claimed in claim 1, further comprising a plurality of solder balls, which are placed onto one side of the substrate.

* * * * *